United States Patent [19]
Fukagai et al.

[11] Patent Number: 5,762,705
[45] Date of Patent: Jun. 9, 1998

[54] FABRICATION METHOD OF SEMICONDUCTOR LASER BY MOVPE

[75] Inventors: Kazuo Fukagai; Shin Ishikawa, both of Tokyo, Japan

[73] Assignee: NEC Corporation, Tokyo, Japan

[21] Appl. No.: 282,457

[22] Filed: Jul. 29, 1994

[30] Foreign Application Priority Data

Jul. 29, 1993  [JP]  Japan .................. 5-187852

[51] Int. Cl.$^6$ .................................. C30B 25/02
[52] U.S. Cl. .................. 117/89; 117/90; 438/289
[58] Field of Search ............ 117/89, 90; 437/129; 438/289

[56] References Cited

U.S. PATENT DOCUMENTS

| | | | |
|---|---|---|---|
| 4,804,639 | 2/1989 | Yablonovitch | 117/89 |
| 5,256,580 | 10/1993 | Gaw et al. | 437/129 |
| 5,296,088 | 3/1994 | Kodama et al. | 117/89 |

FOREIGN PATENT DOCUMENTS

| | | | |
|---|---|---|---|
| 631298 | 12/1994 | European Pat. Off. | 117/89 |
| 52199 | 3/1987 | Japan | 117/89 |
| 182299 | 7/1988 | Japan | 117/89 |

OTHER PUBLICATIONS

N. Watanabe et al., "Low–Temperature Metalorganic Chemical Vapor Deposition Growth of InGaAs for a Non–Alloyed Ohmic Contact to n–GaAs," Jpn. J. Appl. Phys. vol. 33 (1994) pp. L271–L274.

"high–power conversion efficiency in a strained in GaAs/AlGaAs quantum well laser", J.Appl. Phys., vol. 65, No. 9, 1 May 1989, by D.P. Bour et al., pp. 3340–3343.

Electronics Letters, vol. 25, No. 23, Nov. 9, 1989, pp. 1563–1565. M. Okayasu et al., "High–Power 0.98um GaInAs strained Quantum Well Lasers for $Er^{3+}$—Doped Fibre Amplifier".

Low–threshold disorder–defined buried heterostructure strained–layer $Al_yGa_{1-y}As$–GaAs–$In_xGa_{1-x}As$ quantum well lasers ($\lambda$~910 nm), Appl. Phys. Lett. vol. 54, No. 10, Mar. 6, 1989, by J.S. Major et al. pp. 913–915.

Ethyldimethylindium for the growth of InGaAs–GaAs strained–layer lasers by metalorganic chemical vapor deposition, Appl. Phys. Lett. vol. 55, No. 24, 11 Dec. 1989, by P.K. York et al., pp. 2476–2478.

"Metalorganic chemical vapor deposition of InGaAs–GaAs–AlGaAs strained–layer quantum well lasers", Journal of Crystal Growth, vol. 107, 1991, by P.K. York et al. pp. 741–750.

"Index–guided operation in narrow strip InGaAs–GaAs strained–layer quantum well heterostructure lasers by MeV oxygen implantation", Appl. Phys. Lett., vol. 58, No. 19, 13 May 1991, by J.J. Alwan et al., pp. 2058–2060.

"Graded–index separate–confinement InGaAs/GaAs strained–layer quantum well laser grown by metalorganic chemical vapor deposition", Appl. Phys. Lett., vol. 49, No. 24, 15 Dec. 1986, by D. Feketa et al., pp. 1659–1660.

(List continued on next page.)

Primary Examiner—Robert Kunemund
Attorney, Agent, or Firm—Young & Thompson

[57] ABSTRACT

A fabrication method of a semiconductor QW laser by MOVPE with a high fabrication yield, providing a laser device sufficiently reliable in operation over long period of time and applicable for optical communications. An InGaAs QW active layer is grown on a first semiconductor layer formed on or over a semiconductor substrate at a growth temperature ranging from 580° to 640° C. Then, a second semiconductor layer is grown on the active layer at the same growth temperature as that of the active layer. Preferably, the active layer is grown under a condition that the total pressure in a growth chamber is substantially equal to an atmospheric pressure and a partial pressure of arsine ($AsH_3$) for As component ranges from $1.6\times10^{-7}$ to $3\times10^{-1}$ Torr.

12 Claims, 8 Drawing Sheets

OTHER PUBLICATIONS

Electronics Letters, vol. 26, No. 25, 6 Dec. 1990, pp. 2083–2084, S.L. Yellen et al., "200.000h InGaAs Quantum Well Lasers".

"Viable strained-layer laser at λ=1100 nm", *J. Appl. Phys.Lett.*, vol. 67, No. 2, 15 Jan. 1990, by R.G. Waters, pp. 1132–1134.

Electronics Letters, vol. 26, No. 4, 15 Feb. 1990, pp. 233–234, D.F. Welch, et al. "High-Power Single Mode InGaAs/AlGaAs Laser Diodes at 910 nm".

"Gain characteristics of strained quantum well lasers", *Appl. Phys. Letter.* vol. 56, No. 1, 1 Jan. 1990, by D.F. Welch et al., pp. 10–12.

"Organometallic Vapor Phase Epitaxy of High-Performance Strained-Layer InGaAs-AlGaAs Diode Lasers", *IEEE Journal of Quantum Electronics*, vol. 27, No. 3, Mar. 1991, by C.A. Wang et al., pp. 681–686.

"Very high efficiency GainAsP/GaAs strained-layer quantum well lasers (λ=980 nm) with GainAsP optical confinement layers", *Appl. Phys. Lett.*, vol. 61, No. 3, 20 Jul. 1992, by S.H. Groves et al., pp. 255–257.

High-Temperature Operation of InGaAs Strained Quantum-Well Lasers, *IEEE Photonics Technology Letters*, vol. 3, No. 4, Apr. 1991, by R.J. Fu et al, pp. 308–310.

"High-Power 980-nm AlGaAs/InGaAs Strained Quantum-Well Lasers Grown by OMVPE", *IEEE Photonics Technology Letters*, vol. 3, No. 5, May 1991, by Y.K. Chen et al., pp. 406–408.

Electronics Letters, vol. 28, No. 13, 18 Jun. 1992, pp. 1234–1235, Y.K. Sin et al. "InGaAs-GaAs-InGaP Channel Guide Strained Quantum Well Lasers with Output Powers over 300 mW."

"Growth and Characterization of InAs/GaAs Monolayer Structures", *Journal of Crystal Growth*, vol. 93, by T. Fukui, pp. 301–306.

"Thermally Induced In/Ga Interdiffusion in $In_xGa_{1-x}As$/GaAs Strained Single Quantum Well Grown by LPMOVPE", *Journal of Crystal Growth*, vol. 93, 1988 by F. Iikawa et al., pp. 336–341.

"Heteroepitaxy of InGaAs on GaAs Substrate with InAlAs Intermediate Layer", *Journal of Crystal Growth*, vol. 93, 1988, by Takashi Ueda et al., pp. 517–522.

"MOVPE growth of uniform AlGaAs and InGaAs using organo-arsine with inverted-horizontal atmospheric-pressure reactor", *Journal of Crystal Growth*, vol. 107, 1991, by T. Kikkawa et al., pp. 370–375.

"Vapor Pressures and Phase Equilibria in the Ga–As System", *J. Phys. Chem.*, vol. 28, 18 May 1967, by J.R. Arthur, pp. 2257–2267.

FABRICATION METHOD OF SEMICONDUCTOR LASER BY MOVPE

BACKGROUND OF THE INVENTION

1. Field of the Invention

The present invention relates to a fabrication method of a semiconductor laser by Metal Organic Vapor Phase Epitaxy (MOVPE).

2. Description of the Prior Art

A conventional semiconductor laser with a strained Quantum Well (QW) active layer is shown in FIG. 1. An n-AlGaAs lower cladding layer 19 is formed on an n-GaAs substrate 18 and an AlGaAs/GaAs lower guiding layer 20 is formed on the lower cladding layer 19. An InGaAs/GaAs strained QW active layer 21 containing a single or several InGaAs strained QW sublayers and GaAs barrier sublayers is formed on the lower guiding layer 20 and an AlGaAs upper guiding layer 22 is formed on the strained QW active layer 21. A p-AlGaAs upper cladding layer 23 is formed on the upper guiding layer 22 and a p-GaAs cap layer 24 is formed on the upper cladding layer 23.

The conventional semiconductor laser shown in FIG. 1 is generally fabricated by Metal Organic Vapor Phase Epitaxy (MOVPE). During the growth process of the InGaAs/GaAs strained QW active layer 21, the higher the growth temperature the, more remarkable revaporization of indium (In) during the growth process of the InGaAa strained QW sublayer of the active layer 21. As a result, the growth temperature of the active layer 21 is popularly set as 700° C. or lower.

On the other hand, to restrict both mixture of carbon and reduction in dopant decomposition efficiency, the growth temperatures of the n-AlGaAs lower cladding layer 19, the AlGaAs lower guiding layer 20, the AlGaAs upper guiding layer 22 and p-AlGaAs upper cladding layer 23 are preferably set as 700° C. or higher.

For example, as disclosed in IEEE PHOTONICS TECHNOLOGY LETTERS, NO.4, VOL.3, PP308–310, APRIL 1991, the growth to temperature of an InGaAs strained QW active layer is set as 610° C., and the growth temperatures of AlGaAs upper and lower cladding layers are set as 750° C.

Also, during growth of, the n-AlGaAs lower cladding layer 19, the AlGaAs lower guiding layer 20, the AlGaAs upper guiding layer 22, and the p-AlGaAs upper cladding layer 23 when the (V/III) flow rate ratio is low, carbon tends to be introduced into the layers 19, 20, 22 and 23 thus grown. Here, the (V/III) flow rate ratio is defined as the ratio of the flow rate of the v group gaseous source material, or arsenic (As) to the flow rates of the III group gaseous source materials, or aluminum (Al) and gallium (Ga).

To avoid such the carbon introduction into the layers 19, 20, 22 and 23, in popular, the layers 19, 20, 22 and 23 are grown at a high (V/III) flow rate ratio.

As a result, in the case of the atmospheric pressure MOVPE where epitaxial growth is carried out under the condition that (a) the reactor tube pressure is maintained at the atmospheric pressure, and (b) the partial pressure of arsine (AsH$_3$) for arsenic component is popularly maintained at 1Torr or higher during the growth process of the InGaAs/GaAs strained QW active layer 21.

For example, as disclosed in APPLIED PHYSICS LETTERS, NOV.24, VOL.55, PP2476–2478, DECEMBER 1989, the partial pressure of arsine of an InGaAs strained QW active layer is maintained at approximately 1.4 Torr, which was obtained by calculation from description in this paper.

However, with the conventional fabrication methods described above, there is a problem that no semiconductor laser which is sufficiently reliable in operation over long period of time can be fabricated, which means that the laser is not applicable for optical communications There is another problem that the above conventional fabrication methods cannot provide a semiconductor laser with a high fabrication yield.

SUMMARY OF THE INVENTION

Accordingly, an object of the present invention is to provide a fabrication method of a semiconductor laser which can provide a semiconductor laser sufficiently reliable in operation over long period of time and applicable for optical communications.

Another object of the present invention is to provide a fabrication method of a semiconductor laser which can fabricate a semiconductor laser with a higher fabrication yield than that of the conventional methods.

A fabrication method of a semiconductor laser according to a first aspect of the present invention includes a step of growing a first AlGaAs layer on or over a semiconductor substrate, a step of growing an InGaAs/GaAs active layer containing an InGaAs strained QW sublayer and GaAs barrier sublayers on the first semiconductor layer at a growth temperature ranging from 580 to 640° C., and a step of growing a second AlGaAs layer on the active layer. The growth temperature at the end of the growth process of the first AlGaAs layer is controlled within the range from 580° to 640° C. The growth temperature at the beginning of the growth process of the second AlGaAs layer is equal to the growth temperature of the active layer. If an atmospheric pressure MOVPE system is used, a value of 1.2 Torr may be used as the partial pressure of arsine during the step of growing the active layer.

As the first and second semiconductor layers, any semiconductor layer may be used such as a GaAs barrier layer and an AlGaAs guiding layer, respectively.

With the fabrication method of the first aspect, the InGaAs/GaAs active layer containing the InGaAs strained QW sublayer and the GaAs barrier sublayers is grown on the first AlGaAs layer at a growth temperature ranging from 580° to 640° C., so that the active layer thus grown has superior homogeneity of indium (In) component and superior light emission characteristic or performance.

In addition, since the growth of the second AlGaAs layer is initiated on the active layer at the same growth temperature as that of the active layer, the density of lattice defects introduced into the active layer is lower than that of the case in which the surface of the active layer is exposed to the atmosphere whose temperature is higher than the growth temperature of the active layer.

As a result, a semiconductor laser sufficiently reliable in operation over long period of time is fabricated, which means that the laser thus fabricated is applicable for optical communications.

Since the active layer contains the lower density of lattice defects introduced thereinto, a higher fabrication yield can be obtained.

A fabrication method of a semiconductor laser according to a second aspect of the present invention includes a step of growing a first AlGaAs layer on or over a semiconductor substrate, and a step of growing an InGaAs/GaAs active layer on the first AlGaAs layer at a growth temperature ranging from 580° to 640° C.

The step of growing the InGaAs/GaAs active layer is carried out under a condition that the total pressure in a growth chamber is an atmospheric pressure whose partial pressure of arsine (AsH$_3$) for As component ranges from $1.6 \times 10^{-7}$ to 0.3 Torr.

The step of growing the InGaAs/GaAs active layer is carried out using an atmospheric pressure MOVPE system.

With the fabrication method of the second aspect, the InGaAs/GaAs QW active layer is grown at the same growth temperature as the first aspect, so that the active layer thus grown has superior homogeneity of In component and superior light emission characteristic or performance.

In addition, since at least the active layer is grown under a condition that the total pressure in a growth chamber is the atmospheric pressure whose partial pressure of arsine ranges from $1.6 \times 10^{-7}$ to 0.3 Torr, the density of lattice defects introduced into the active layer is lower than that of the case in which the growth of the second AlGaAs layer is initiated at a higher growth temperature.

As a result, similar to the first aspect, a semiconductor laser sufficiently reliable in operation over long period of time is fabricated, which means that the laser thus fabricated is applicable for optical communications.

Since the active layer contains the lower density of lattice defects introduced thereinto, a higher fabrication yield can be obtained.

DETAILED DESCRIPTION OF THE PREFERRED EMBODIMENTS

Figure 1:
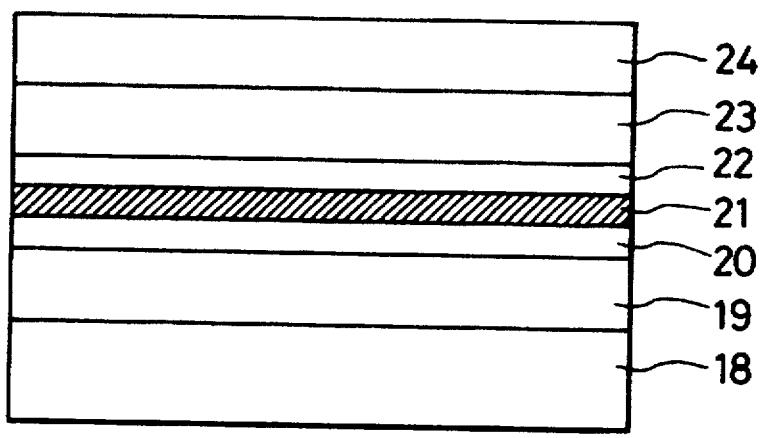
FIG. 1 schematically shows a cross-section of a semiconductor QW laser fabricated by the conventional methods.

Preferred embodiments of the present invention will be described bellow while referring to the drawings attached.

Effect of Growth Temperature

FIGS. 2, 3, 4A and 4B show an experimental result to examine the effects of the growth temperature, which is carried out using an atmospheric pressure MOVPE system.

Figure 3:
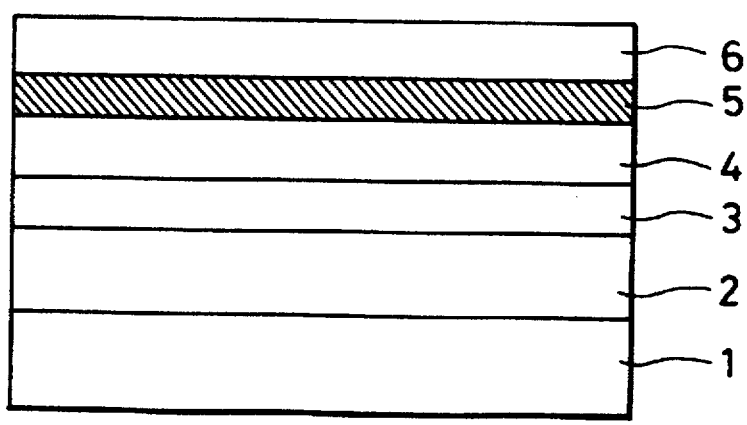
FIG. 3 schematically shows a cross-section of the semiconductor layer structure fabricated to examine the effect of the growth temperature or arsine partial pressure on the quality of the InGaAs strained QW layer.

In the experiment, a strained QW active layer of InGaAs is epitaxially grown under the following conditions:

Trimethylgallium (TMG) [(CH$_3$)$_4$Ga], trimethylindium (TMI) and arsine (AsH$_3$) are supplied to the growth chamber of the MOVPE system for Ga, In and As components, respectively During the growth process of an InGaAs active layer 5 shown in FIG. 3, the composition of vapor-phase In the growth chamber of the atmospheric pressure MOVPE system is maintained at 0.35. Here, the "Composition of vapor-phase In" is defined as a ratio of the TMI partial pressure to the sum of the TMG and TMI partial pressures in the chamber.

Figure 2:
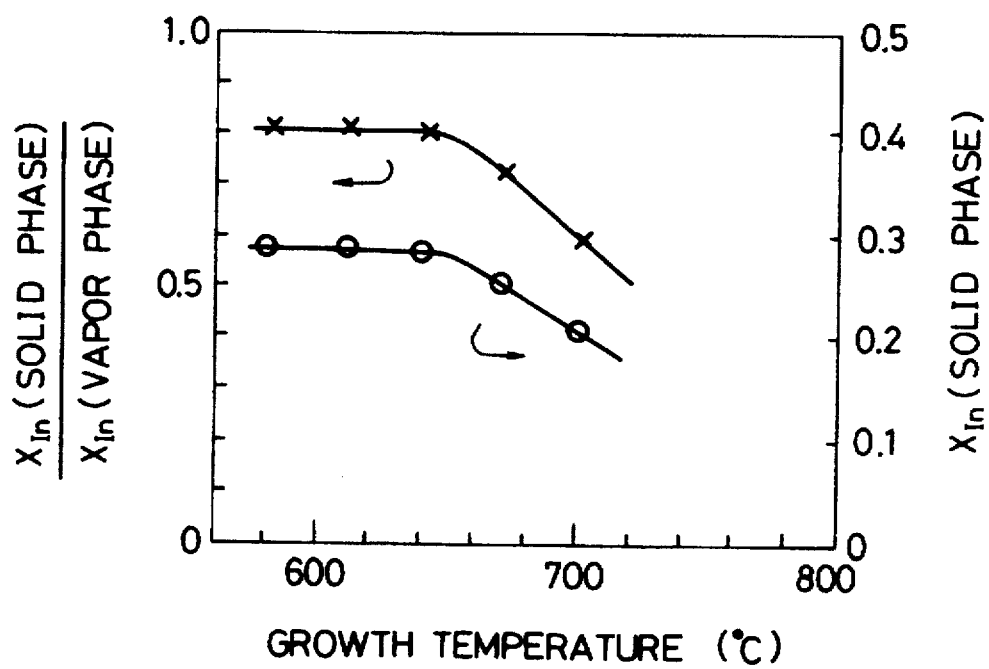
FIG. 2 is a graph showing growth-temperature dependence of an In component $X_{In}$(solid phase) and an incorporation ratio $X_{In}$(solid phase)/$X_{In}$(vapor phase) of an InGaAs strained QW active layer of a semiconductor.

As shown in FIG. 2, the In component $X_{In}$(solid phase), which is defined as the In component of the InGaAs active layer 5 thus grown, changes dependent on its growth temperature. Also, the incorporation ratio [$X_{In}$(solid phase)/$X_{In}$(vapor phase)] of the active layer 5, which is defined as a ratio of the In incorporated into the InGaAs active layer 5 thus grown to the vapor-phase In component contained in the growth chamber, changes dependent on the growth temperature in the similar way to the solid-phase In component $X_{In}$.

In FIG. 2, an upper curve shows the incorporation ratio [$X_{In}$(solid phase)/$X_{In}$(vapor phase)] and a lower curve shows the In component $X_{In}$(solid phase).

It is seen from FIG. 2 that the incorporation ratio [$X_{In}$(solid phase)/$X_{In}$(vapor phase)] decreases dependent on the growth temperature in the region whose growth temperature is higher than 640° C. Therefore, to obtain better homogeneity of the In component of the active layer 5, it is seen that the growth temperature is required to be 640° C. or lower. In other words, the upper limit of the growth temperature of the strained QW InGaAs active layer 5 is 640° C.

The semiconductor layer structure shown in FIG. 3 is fabricated using the atmospheric pressure MOVPE system. During the growth processes of the layer structure, the growth temperature and arsine partial pressure changes according to the profiles shown in FIGS. 4A and 4B respectively.

First, TMG [(CH$_3$)$_3$Ga] for Ga component and arsine for As component are supplied into the growth chamber, and a GaAs buffer layer 2 having a thickness of 0.5 μm is epitaxially grown on an n-GaAs substrate 1 doped with Si.

The growth temperature and arsine partial pressure during this process are maintained at 760° C. (region A1 in FIG. 4A) and 3.2 Torr (region C1 in FIG. 4B), respectively.

Next, while arsine is kept to be supplied in the growth chamber to prevent As atoms from desorbing from the surface of the grown layer, TMG [$(CH_3)_3Ga$] is interrupted to be supplied into the growth chamber. Then, the growth temperature is lowered to 610° C. as shown in the region B1 in FIG. 4A, and the arsine partial pressure in the chamber is lowered to 1.4 Torr as shown in region D1 in FIG. 4B. Then, an $Al_{0.4}Ga_{0.6}As$ layer 3 having a thickness of 0.05 µm is epitaxially grown on the GaAs buffer layer 2.

During this process, trimethylaluminum (TMA) [$(CH_3)_3Al$] is used for Al component material.

Subsequently, the arsine partial pressure in the chamber is lowered to 1.2 Torr (region E1 in FIG. 4B) and then, a GaAs barrier layer 4 having a thickness of 0.5 µm is epitaxially grown on the $Al_{0.4}Ga_{0.6}As$ layer 3. An $In_{0.24}Ga_{0.74}As$ strained QW layer 5 having a thickness of 200 Ås epitaxially grown on the GaAs barrier layer 4, and a GaAs barrier layer 6 having a thickness of 0.3 µm is epitaxially grown on the GaAs barrier layer 5.

Figure 4A:
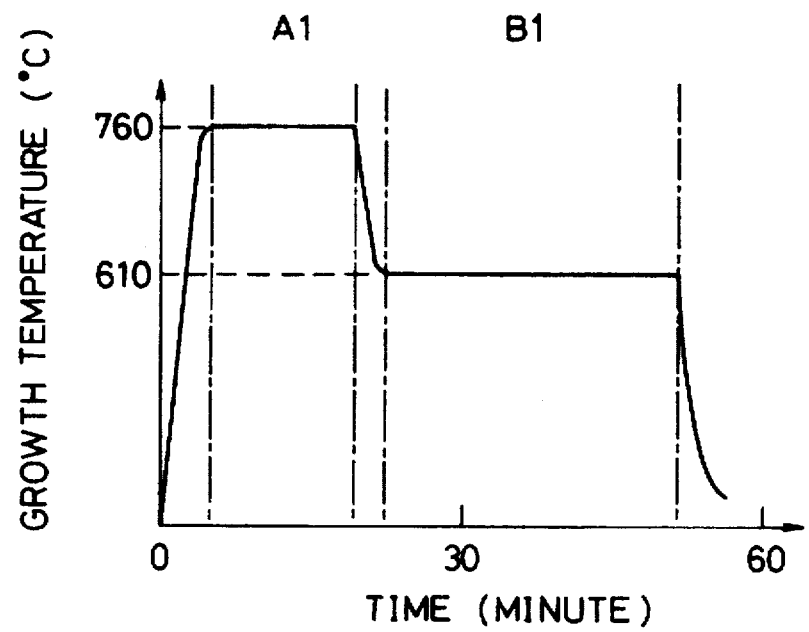
FIG. 4A shows a profile of the growth temperature used for growing the semiconductor layer structure in FIG. 3.
Figure 4B:
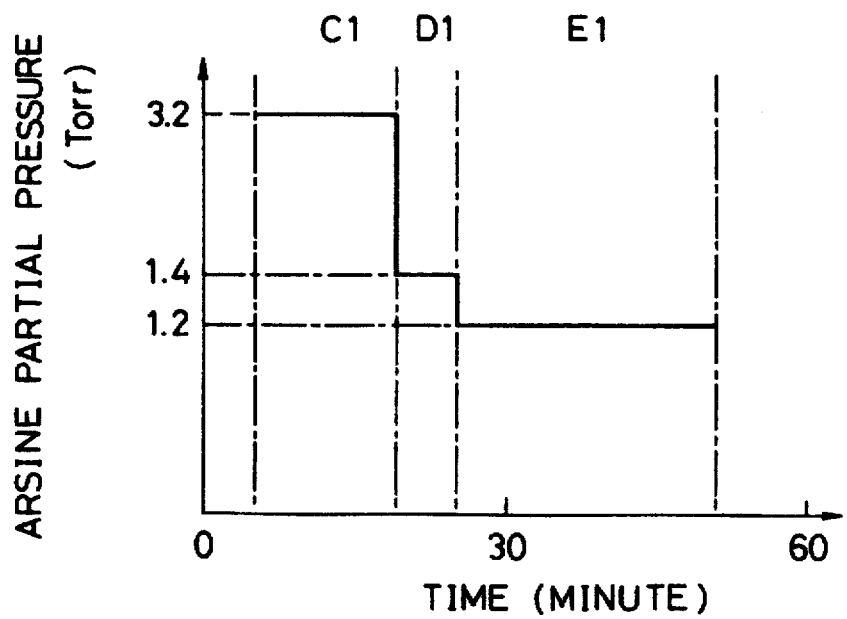
FIG. 4B shows a profile of the arsine partial pressure used for growing the semiconductor layer structure in FIG. 3.

It is seen from FIGS. 4A and 4B that all the layers 4, 5 and 6 are grown at the arsine partial pressure of 1.2 Torr and at the growth temperature of 610° C.

Thus, the semiconductor layer structure as shown in FIG. 3 is fabricated.

The $In_{0.24}Ga_{0.76}As$ strained QW layer 5 has an emission spectrum whose peak wavelength is 1.07 µm.

Figure 5:
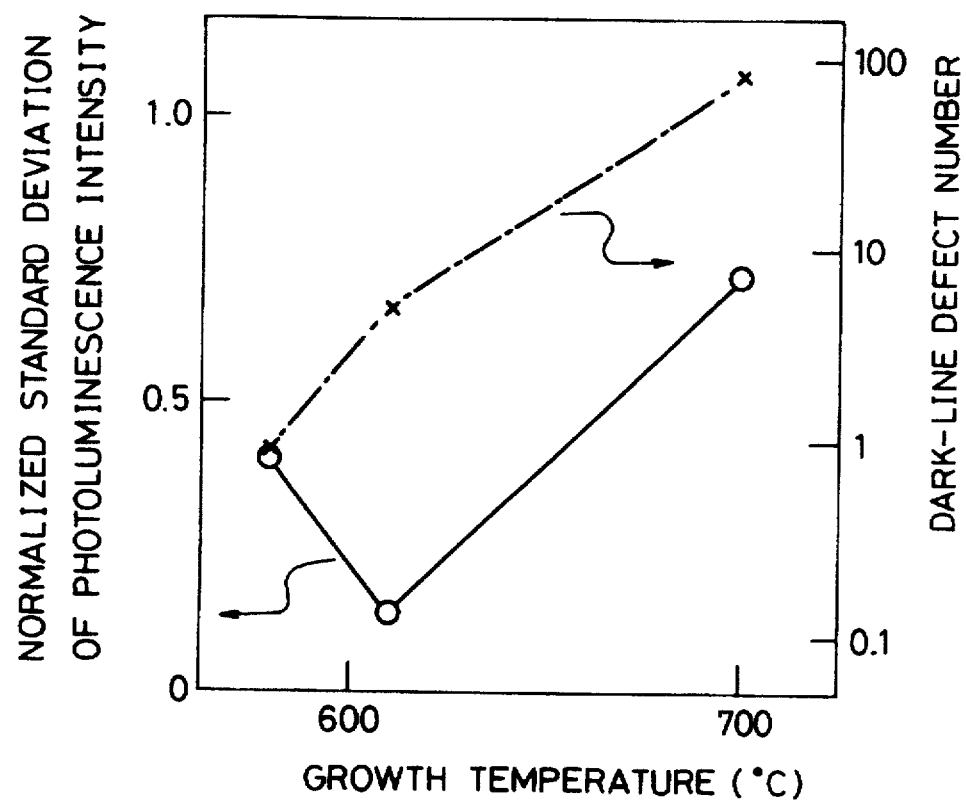
FIG. 5 is a graph showing growth-temperature dependence of the normalized standard deviation of photoluminescence intensity of the InGaAs strained QW active layer and growth-temperature dependence of the average number of dark-line defects contained in a 200 μm square area of the active layer.

FIG. 5 shows growth-temperature dependence of the normalized standard deviation of photoluminescence (wavelength: 1.07 µm) intensity of the InGaAs strained QW active layer 5 and growth-temperature dependence of the average number of dark-line defects contained in a 200 µm square area of the active layer 5. The standard deviation of photoluminescence intensity is normalized by the average of the photoluminescence intensity within the measured small area.

In FIG. 5, there are also shown data of semiconductor layer structures having the same layer structure as that in FIG. 3 and having the growth temperatures in the region B1 are 580° C. and 700° C., respectively.

The normalized standard deviation of photoluminescence intensity shows homogeneity of the light emission characteristic of the active layer 5 along the surface and a small value of the standard deviation is preferable.

The number of dark-line defects shows easiness of introduction of misfit dislocations into the strained QW active layer 5 and a small value of the numbers is preferable.

From FIG. 5, it is seen that the normalized standard deviation of photoluminescence intensity tends to lower in the area of the growth temperature of 610° C. or lower. Therefore, to obtain a strained QW active layer with better homogeneity of the light emission characteristic, it is seen that the growth temperature should be 580° C. or higher. In other words, the lower limit of the growth temperature of the strained QW InGaAs active layer 5 is 580° C.

As described above, it can be said that the preferable growth temperature for the strained QW InGaAs active layer 5 ranges from 580° to 640° C. from the viewpoint of stability of In incorporation rate into a grown layer (FIG. 2) and homogeneity of the light emission characteristic (FIG. 5).

Next, the preferable growth temperature of the GaAs barrier layer 6 formed after the active layer 5 is described below.

From FIG. 5, it is seen that the average number of the dark-line defects increase dependent on the growth temperature. We assume that introduction, movement and breeding of the defects of the active layer 5 occur during not only the growth process of the active layer 5 but also the growth process of the GaAs barrier layer 6. Therefore, to obtain the QW active layer 5 having few defects, it is advantageous that the growth temperature of the active layer 5 is possibly low and at the same time, the growth temperature of the GaAs barrier layer 6 is substantially equal to that of the active layer 5.

With the above experiment, the $In_{0.24}Ga_{0.76}As$ strained QW active layer 5 is epitaxially grown on the GaAs barrier layer 4 at the growth temperature ranging from 580° to 640° C., so that the active layer 5 thus grown has is superior homogeneity of In component and superior optical emission characteristics or performance.

In addition, since the GaAs barrier layer 6 is epitaxially grown on the $In_{0.24}Ga_{0.76}As$ strained QW active layer 5 at the same growth temperature as that of the active layer 5, the active layer 5 is lower in density of the lattice defect introduced into the active layer 5 than the case that the GaAs barrier layer 6 is grown at a higher growth temperature than the active layer 5.

As a result, a semiconductor QW laser fabricated by using the above growth temperature condition can operate stably over long period of time, providing a sufficient reliability in operation. The laser thus obtained is applicable for optical transmissions.

Since the active layer 5 is lower in density of the lattice defect, the laser can be fabricated at a higher yield than that of the conventional methods.

Though the method of this embodiment is carried out using an atmospheric pressure MOVPE system, reduced pressure MOVPE system may he used.

Effect of Partial Pressure of Arsine

FIGS. 2, 4A, 6 and 7 show experimental results to examine the effect of the partial pressure of arsine. The semiconductor layer structure used in this experiment is the same in structure as that of the above experiment about the effect of the growth temperature shown in FIG. 3.

Similar to the above experiment concerning the effect of the growth temperature, the experiment relating to the arsine partial pressure is carried out using an atmospheric pressure MOVPE system, and trimethylgallium (TMG) [$(CH_3)_3Ga$], trimethylaluminum (TMI) [$(CH_3)_3In$], arsine ($AsH_3$) and trimethylaluminum (TMA) [$(CH_3)_3Al$] are used for Ga, In, As and Al components, respectively. The growth temperature is the same as that in the above experiment about the effect of the growth temperature and is changed according to a profile shown in FIG. 4A. However, the partial pressure of arsine is changed according to a profile shown in FIG. 6 instead of that shown in FIG. 4B.

First, a GaAs buffer layer 2 having a thickness of 0.5 µm is epitaxially grown on an n-GaAs substrate 1 doped with Si in an atmospheric pressure. The growth temperature and arsine partial pressure during this, process are 760° C. (region A1 in FIG. 4A) and 3.2 Torr (region C2 in FIG. 6), respectively. The profile in the region C2 is the same as that in the region C1 in FIG. 4B.

Figure 6:
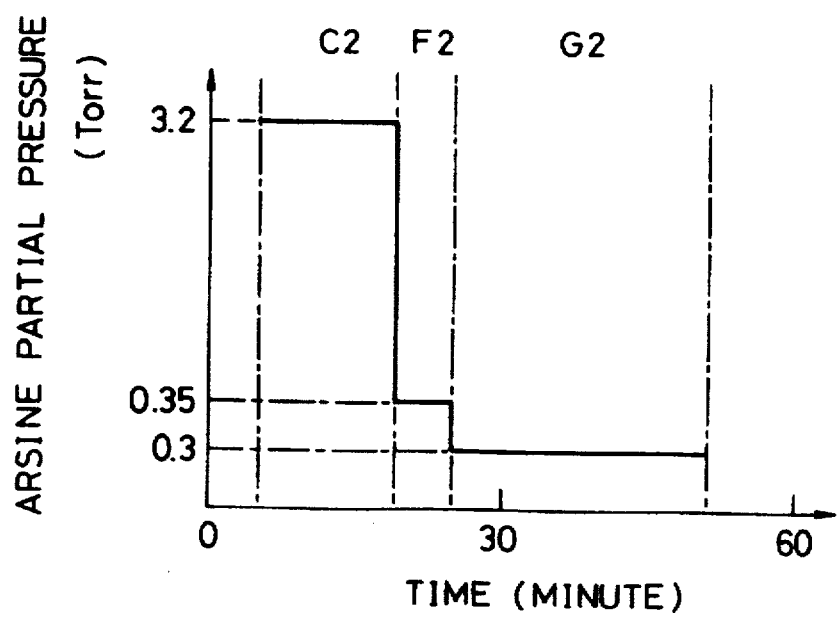
FIG. 6 shows a profile of the arsine partial pressure in a fabrication method according to a second embodiment.

Next, TMG [$(CH_3)_3Ga$] for Ga component is interrupted to be supplied into the growth chamber and the arsine partial pressure therein is lowered to 0.35 Torr (region F2 in FIG. 6). Also, the growth temperature is lowered to 610° C. (region B1 in FIG. 4A). Then, an $Al_{0.4}Ga_{0.6}As$ layer 3 having a thickness of 0.05 µm is epitaxially grown on the GaAs buffer layer 2.

Subsequently, the arsine partial pressure in the chamber is further lowered to 0.3 Torr (region G2 in FIG. 6) and then, a GaAs barrier layer 4 having a thickness of 0.5 µm is epitaxially grown on the $Al_{0.4}Ga_{0.6}As$ layer 3. While the arsine partial pressure and the growth temperature are kept at the same values as those of the prior growing process, an $In_{0.24}Ga_{0.76}As$ strained QW layer 5 having a thickness of 200 Å is epitaxially grown on the GaAs barrier layer 4, and a GaAs barrier layer 6 having a thickness of 0.3 µm is epitaxially grown on the GaAs barrier layer 5.

Thus, a strained QW laser wafer as shown in FIG. 3 is fabricated.

The $In_{0.24}Ga_{0.76}As$ strained QW layer 5 has an emission spectrum whose peak wavelength is 1.07 µm.

Figure 7:
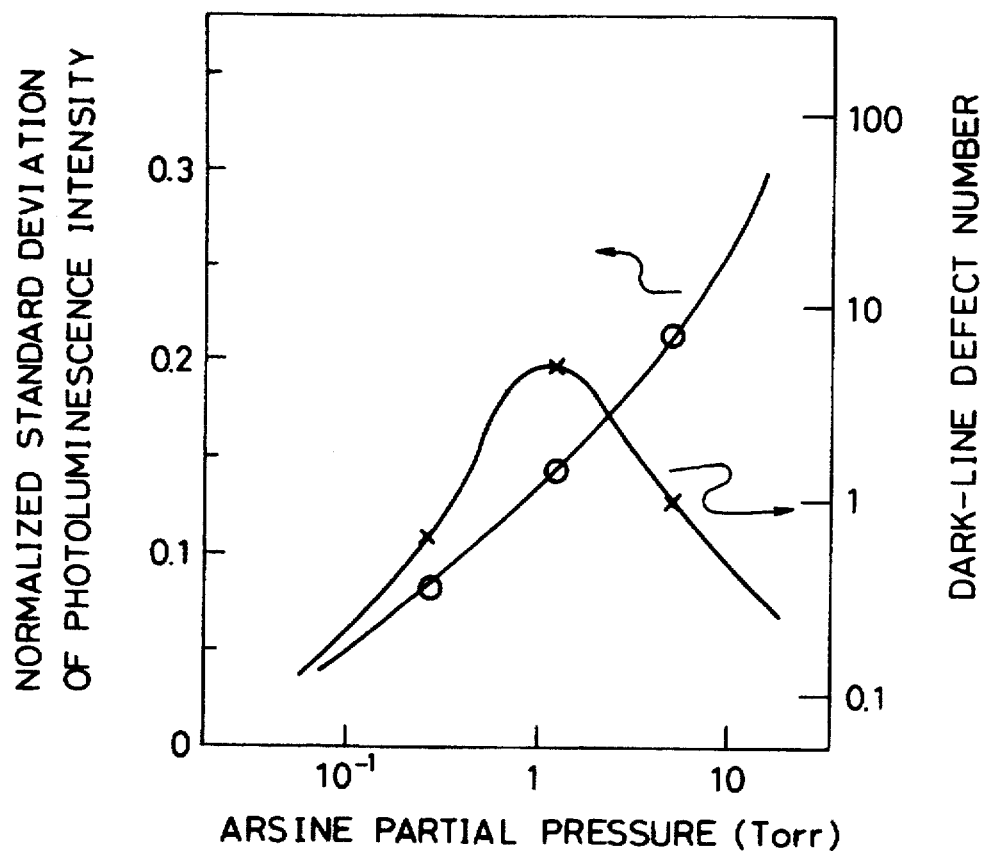
FIG. 7 is a graph showing arsine partial-pressure dependence of the normalized standard deviation of photoluminescence intensity of the InGaAs strained QW active layer fabricated by the method of the second embodiment, and arsine partial-pressure dependence of the number of dark-line defects contained in a 200 μm square area or the active layer.

FIG. 7 shows arsine partial-pressure dependence of the normalized standard deviation of photoluminescence (wavelength: 1.07 µm) intensity of the InGaAs strained QW active layer 5 fabricated in the experiment about the arsine partial pressure, and arsine partial-pressure dependence of the number of dark-line defects contained in a 200 µm square area of the active layer 5. The standard deviation of photoluminescence intensity is normalized by the average of the photoluminescence intensity within the measured small area.

In FIG. 7, there are also shown data of strained QW semiconductor laser wafers which has the same layer structure as shown in FIG. 3 and is fabricated at the arsine partial pressures of 5.6 Torr and 4.8 Torr in the region F2 and G2 are, respectively.

From FIG. 7, it is seen that the normalized standard deviation of photoluminescence intensity tends to increase in the area of the arsine partial pressure of 4.8 Torr or higher while the number of the dark-line defects decreases in this area. On the other hand, it is also seen that both the normalized standard deviation of photoluminescence intensity and the number of the dark-line defects tend to decrease in the area of the arsine partial pressure of 4.8 Torr or lower.

Therefore, to obtain a strained QW active layer having better homogeneity of the light emission characteristic and few dark-line defects, it is seen that the arsine partial pressure for the active layer should be 0.3 Torr or lower. In other words, the upper limit of the arsine partial pressure of the strained QW InGaAs active layer 5 is 0.3 Torr.

Next, the lower limit of the arsine partial pressure of the strained QW InGaAs active layer 5 is described below.

As disclosed in JOURNAL OF PHYSICS AND CHEMISTRY OS SOLIDS, VOL.28, PP2257-2267, 1967, As atoms existing on the surface of a GaAs layer tends to become $AS_4$ to be dissociated from the surface. Therefore, according to the chemical equilibrium theory, a surface containing excessive Ga atoms is grown at the partial pressure of vapor phase $As_4$ of 760 Torr or less when the growth temperature is 640° C., for example.

The dissociation pressure of $As_2$ from the Ga excessive surface is $8\times10^{-8}$ Torr, and it is assumed that As atoms does not dissociate from the Ga excessive surface of the GaAs layer when the arsine partial pressure is $1.6\times10^{-7}$ Torr or higher.

Therefore, also in the case of GaAs vapor phase epitaxy, to prevent lattice vacancies of As from generating in a GaAs layer thus grown epitaxially, it is assumed that the GaAs VPE process is preferably carried out at the arsine partial pressure of $1.6 \times10^{-7}$ Torr or higher.

There has been no report about the dissociation pressure of As atoms from the surface of an InGaAs layer, however, it is known that the coupling strength between In and As is more unstable than that between Ga and As and as a result, it is assumed that the InGaAs growth process should be carried out under the arsine partial pressure of $1.6\times10^{-7}$ Torr or higher. This means that the lower limit of the arsine partial pressure of the strained QW InGaAs active layer 5 is $1.6\times10^{-7}$ Torr.

As described above, it can be said that the arsine partial pressure for the strained QW InGaAs active layer 5 ranges from $1.6\times10^{-7}$ Torr to 0.3 Torr from the viewpoint of the lattice defects generated in a grown layer and homogeneity of the light emission characteristic.

With the experiment relating to the arsine partial pressure similar to the above experiment relating to the growth temperature, the InGaAs QW active layer 5 is grown at the growth temperature ranging from 580° to 640° C. Therefore, the active layer 5 thus grown has superior homogeneity of In component and superior optical emission characteristic or performance.

In addition, the active layer 5 is grown under a condition that the total pressure in a growth chamber is the atmospheric pressure whose partial pressure of arsine ($AsH_3$) for As component ranges from $1.6\times10^{-7}$ to $3\times10^{-1}$ Torr. Therefore, the active layer 5 is lower in density of the lattice defect generated in the active layer than the case that the active layer 5 is grown under a different atmospheric condition from the second embodiment.

As a result, similar to the above experiment about the growth temperature, the semiconductor QW laser fabricated in the experiment about the arsine partial pressure can operate stably over long period, providing a sufficient reliability in operation. The laser wafer thus obtained is applicable for optical communications.

Since the active layer 5 is lower in density of the lattice defect, the laser can be fabricated at a high yield.

Though the experiment about the arsine partial pressure is carried out using an atmospheric pressure MOVPE system, reduced pressure MOVPE system may be used.

First Embodiment

Figure 8A:
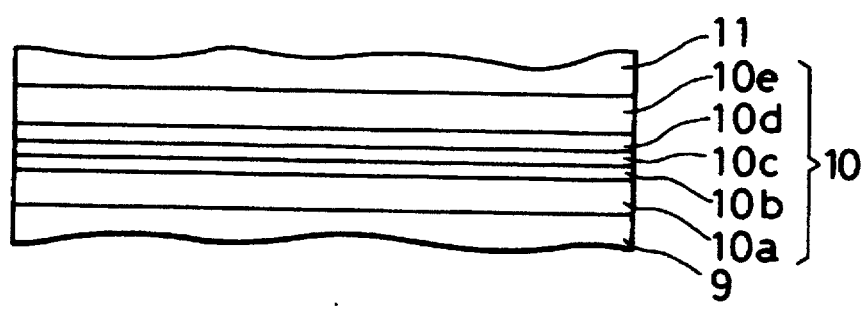
FIG. 8A schematically shows a cross-section of a double QW active layer structure of the semiconductor QW laser shown in FIG. 8.
Figure 8:
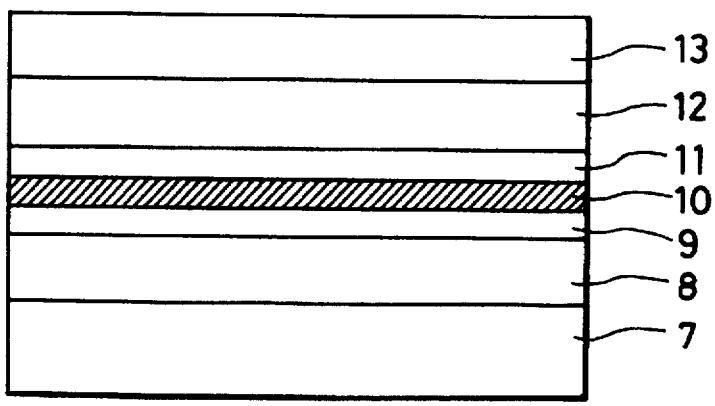
FIG. 8 schematically shows a cross-section of the semiconductor QW laser fabricated by a method according to the first and second embodiments.

FIGS. 8, 8A, 9A and 9B show a fabrication method of a semiconductor QW laser according to a first embodiment of the present invention. A laser wafer fabricated by the first embodiment has a structure as shown in FIGS. 8 and 8A.

Similar to the above two experiment, the method of the first embodiment is also carried out using an atmospheric pressure MOVPE system, and trimethylgalium (TMG) $[(CH_3)_3Ga]$, tetramethylindium (TMI) $[(CH_3)_4In$, arsine ($AsH_3$) and tetramethylaluminum (TMA) $[(CH_3)_4Al]$ are used for Ga, In, As and Al components, respectively.

Figure 9A:
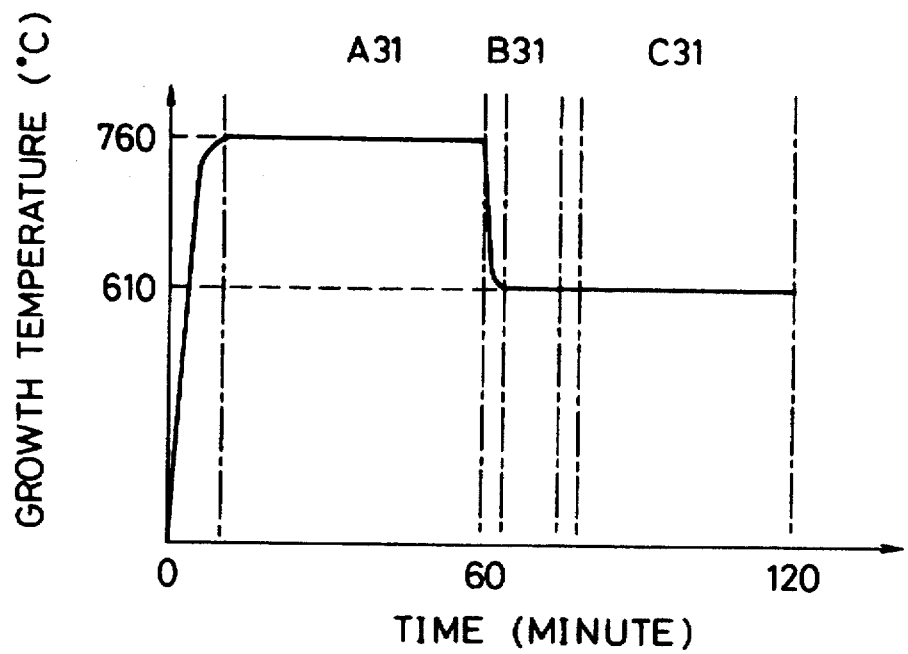
FIG. 9A shows a profile of the growth temperature of the method of the first embodiment.
Figure 9B:
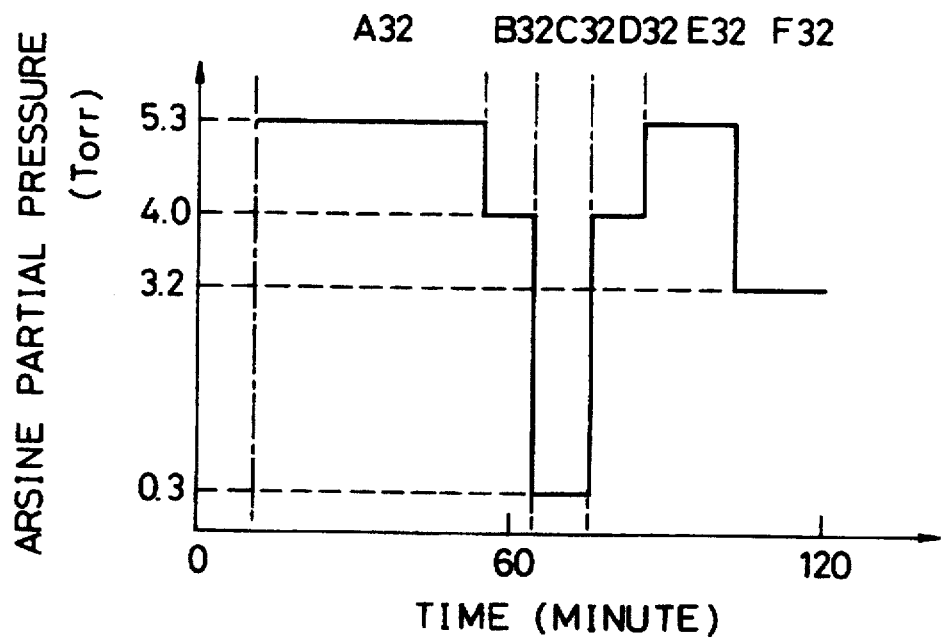
FIG. 9B shows a profile of the arsine partial pressure of the method of the first embodiment.

However, the growth temperature and the partial pressure of arsine are different from the above two experiments and are set according to the profiles shown in FIGS. 9A and 9B, respectively.

First, an $n-Al_{0.4}Ga_{0.6}As$ cladding layer 8 doped with Si and having a thickness of 2 µm is epitaxially grown on an n-GaAs substrate 7 doped with Si in an atmospheric pressure. The growth temperature and arsine partial pressure during this process are 760° C. (region A31 in FIG. 9A) and 5.3 Torr (region A32 in FIG. 9B), respectively.

Next, the arsine partial pressure therein is lowered to 4.0 Torr as shown in the region B32 in FIG. 9B. The growth temperature is maintained at 760° C. as showm in the region A31 in FIG. 9A. Then, an $Al_{0.2}Ga_{0.8}As$ guiding layer 9 having a thickness of 40 nm is epitaxially grown on the n-$Al_{0.4}Ga_{0.6}As$ cladding layer 8. During the growth of the guiding layer 9 the growth temperature is lowered to 610° C. as shown in the region B31 in FIG. 9A.

Subsequently, a double-QW active layer structure 10 having a structure shown in FIG. 8A is formed on the $Al_{0.2}Ga_{0.8}As$ guiding layer 9 by the following processes:

A first GaAs barrier layer 10a having a thickness of 20 nm is epitaxially grown on the $Al_{0.2}Ga_{0.8}As$ guiding layer 9, and a first $In_{0.24}Ga_{0.76}As$ strained layer 10b having a thickness of 6 nm is epitaxially grown on the first GaAs barrier layer 10a. A second Gas barrier layer 10c having a thickness of 5 nm is epitaxially grown on the first $In_{0.24}Ga_{0.76}As$ strained layer 10b, and a second $In_{0.24}Ga_{0.76}As$ strained layer 10d having a thickness of 6 nm is epitaxially grown on the second GaAs barrier layer 10c. Finally, a third GaAs barrier layer 10e having a thickness of 20 nm is epitaxially grown on the second $In_{0.24}Ga_{0.76}As$ strained layer 10d.

The layers 10a, 10b, 10c, 10d and 10e are grown under the conditions that the growth temperature is 610° C. as shown in the region C31 in FIG. 9A and the arsine partial pressure is 0.3 Torr as shown in the region C32 in FIG. 9B.

Next, while keeping the growth temperature at the same value 610° C., the following three layers 11, 12 and 13 are epitaxially grown, successively.

The $Al_{0.2}Ga_{0.8}As$ guiding layer 11 having a thickness of 40 nm is epitaxially grown on the third GaAs barrier layer 10e of the active layer structure 10 at the arsine partial pressure of 4.0 Torr (region D32 in FIG. 9B).

Then, the p-$Al_{0.4}Ga_{0.6}As$ cladding layer 12 doped with Mg and having a thickness of 1.5 μm is epitaxially grown on the $Al_{0.2}Ga_{0.8}As$ guiding layer 11 at the arsine partial pressure of 5.3 Torr (region E32 in FIG. 9B).

Finally, the p-GaAs cap layer 13 doped with Mg and having a thickness of 1.0 μm is epitaxially grown on the p-$Al_{0.4}Ga_{0.5}As$ cladding layer 12 at the arsine partial pressure of 3.2 Torr (region F32 in FIG. 9B).

Thus, the double-QW strained semiconductor laser wafer as shown in FIGS. 8 and 8A is obtained.

As described above, with the fabrication method of the first embodiment, the double-QW strained active layer structure 10 is formed at the growth temperature of 610° C., so that the active layer structure 10 thus formed has superior homogeneity of In component and superior optical emission characteristics or performance.

In addition, the layers 11, 12 and 13 formed on or over the active layer structure 10 are grown under the condition that (a) the total pressure in the growth chamber is the atmospheric pressure, (b) the partial pressure of arsine ranges from $1.6 \times 10^{-7}$ to $3 \times 10^{-1}$ Torr and (c) the growth temperature is the same value of 610° C. as the active layer structure 10. Therefore, the active layer structure 10 can be lower in density of the lattice defect.

Comparative Example 1

Figure 10:
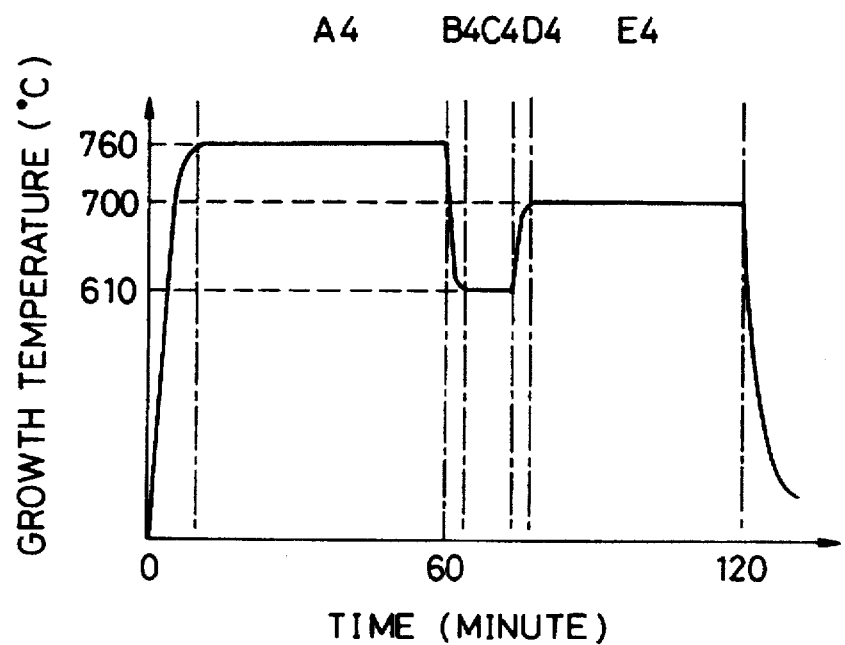
FIG. 10 shows a profile of the growth temperature of the method according to a second embodiment.

FIG. 10 shows a fabrication of a semiconductor QW laser according to a comparative example 1. The laser wafer fabricated by the second comparative example 1 is the same in structure as that of the first embodiment shown in FIGS. 8 and 8A.

Similar to the first embodiment, the method of the comparative example 1 is also carried out using an atmospheric-pressure MOVPE system, and trimethylgallium (TMG) [$(CH_3)_3Ga$], tetramethylindium (TMI) [$(CH_3)_4In$], arsine ($AsH_3$) and trimethylaluminum (TMA) [$(CH_3)_4Al$] are used for Ga, In, As and Al components, respectively.

The arsine partial pressure is changed according to the same profile as the first embodiment as shown in FIG. 9B, however, the growth temperature is changed according to a profile shown in FIG. 10 instead of that shown FIG. 9A.

An n-$Al_{0.2}Ga_{0.8}As$ cladding layer 8, an $Al_{0.2}Ga_{0.8}As$ guiding layer 9, and a double-QW active layer structure 10 are epitaxially grown on the Si-doped n-GaAs substrate 7, in the same growth processes as those in the first embodiment, successively.

Subsequently, an $Al_{0.2}Ga_{0.8}As$ guiding layer 11 is epitaxially grown on the third GaAs barrier layer 10e of the active layer structure 10 at the arsine partial pressure of 4.0 Torr as shown in the region D32 in FIG. 9B. During this growth process, the growth temperature is raised from 610° C. to 700° C., as shown in the region D4 in FIG. 10.

Then, a p-$Al_{0.4}Ga_{0.6}As$ cladding layer 12 doped with Mg and having a thickness of 1.5 μm is epitaxially grown on the $Al_{0.2}Ga_{0.8}As$ guiding layer 11 at the growth temperature of 700° C. (region E4 in FIG. 10) and at the arsine partial pressure of 5.3 Torr (region E32 in FIG. 9B).

Finally, a p-GaAs cap layer 13 is epitaxially grown on the p-$Al_{0.4}Ga_{0.5}As$ cladding layer 12 at the growth temperature of 700° C. (region E4 in FIG. 10) and at the arsine partial pressure of 3.2 Torr (region E32 in FIG. 9B).

Thus, a double-QW strained semiconductor laser as shown in FIGS. 8 and 8A is obtained.

As described above, the comparative example 1 is different from the first embodiment in that the growth temperature is raised from 610° C. to 700° C. after the growth process of the active layer structure 10, and the later growth processes for the layers 11,12 and 13 are carried out at the same temperature 700° C.

With the fabrication method of the second embodiment, since the double-QW strained active layer structure 10 is formed at the growth temperature of 610° C., so that the active layer structure 10 thus formed has superior homogeneity of In component and superior optical emission characteristics or performance.

In addition, the layers 11, 12 and 13 formed on or over the active layer structure 10 are grown under the condition that (a) the total pressure in the growth chamber is the atmospheric pressure, and (b) the partial pressure of arsine ranges from $1.6 \times 10^{-7}$ to $3 \times 10^{-1}$ Torr. Therefore, the active layer structure 10 can be lower in density of the lattice defect.

With the comparative example 1, since the later growth processes for the layers 11,12 and 13 are carried out at a raised growth temperature different from that of the active layer structure 10, obtainable effects or advantages are less than those in the first embodiment. [Fabrication Yield Test]

To confirm the effects or advantages of the invention, the following fabrication yield test was carried out. In the test, laser wafers were fabricated corresponding to the first embodiment, respectively, and laser devices having the structure as shown in FIG. 12 were fabricated using these laser wafers.

Figure 12:
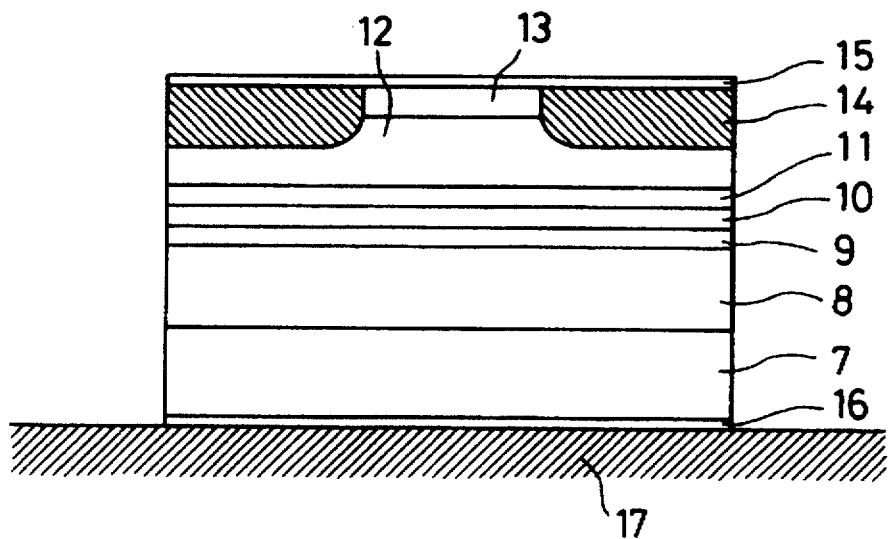
FIG. 12 shows the cross-sectional structure of the Semiconductor QW laser fabricated by the methods of the first and second embodiments and the comparative example.

In FIG. 12, an n-$Al_{0.4}Ga_{0.6}As$ cladding layer 8 doped with Si and having a thickness of 2 μm is formed on an n-GaAs substrate 1 doped with Si. An $Al_{0.2}Ga_{0.8}As$ guiding layer 9 having a thickness of 40 nm is formed on the n-$Al_{0.4}Ga_{0.6}As$ cladding layer 8, and a double-QW active layer 10 is formed on the $Al_{0.4}Ga_{0.6}As$ guiding layer 9. An $Al_{0.2}Ga_{0.8}As$ guiding layer 11 having a thickness of 40 nm is formed on the active layer 10. A p-$Al_{0.4}Ga_{0.6}As$ cladding layer 12 doped with Mg and having a thickness of 1.5 μm is formed on the $Al_{0.2}Ga_{0.8}AS$ guiding layer 11, and p-GaAs cap layer 13 doped with Mg and having a thickness of 1.0 μm is formed on the p-$Al_{0.4}Ga_{0.6}As$ cladding layer 12.

A n-GaAs blocking layer 14 doped with Si and having a thickness of 1.5 μm is formed in the p-GaAs cap layer 13 and the p-$Al_{0.4}Ga_{0.5}As$ cladding layer 12 at each side of the laser device. The surface of the n-GaAs blocking layer 14 and the exposed surface of the p-GaAs cap layer 13 are covered with a p-electrode 15. The back surface of the n-GaAas substrate 7 is covered with an n-electrode 16 and is supported on a heat sink 17 through the n-electrode 16.

Figure 11:
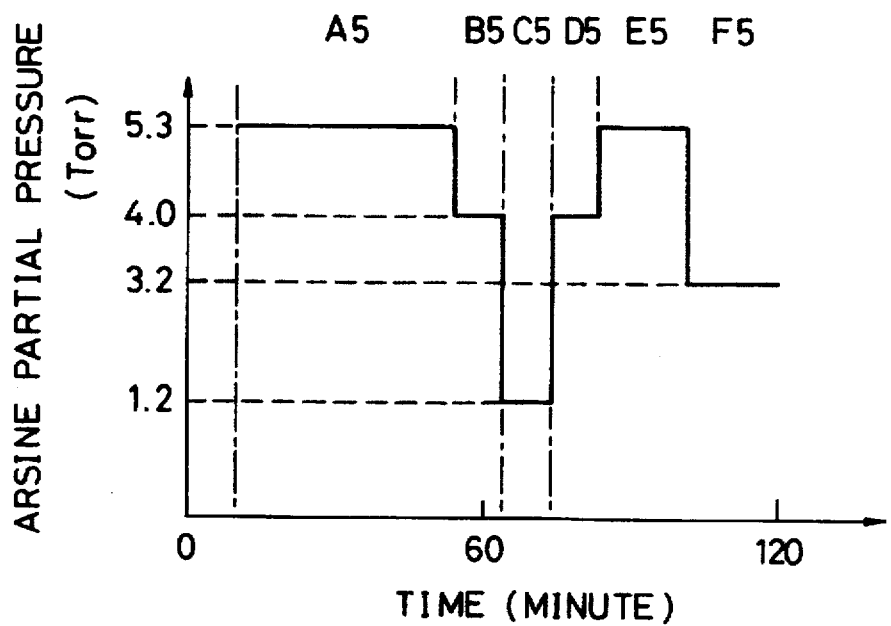
FIG. 11 shows a profile of the arsine partial pressure of a method according to a comparative example.

As a comparative example, laser devices having the same structure as shown in FIG. 12 is fabricated by the following conventional fabrication method:

This conventional method is the same as that of the first embodiment excepting that the double-QW active layer 10 is formed on the $Al_{0.4}Ga_{0.6}As$ guiding layer 9 at the arsine partial pressure of 1.2 Torr according to the profile shown in FIG. 11 (region C5), instead of 0.3 Torr as shown in FIG. 9B (region C32).

From the laser devices thus fabricated, ten samples were selected at random corresponding to the second embodiment and the conventional method. A driving current was supplied to each of the selected samples for 1000 hours at an ambient temperature of 90° C. so that each of the samples emitted 10 mW laser light from one side face thereof.

The fabrication yield was obtained based on the number of the samples in which the measured change rate r of the driving current per hour during the period from 800 to 1000 hours is $2 \times 10^{-5}$ or less. The result of the test is shown in FIG. 13.

Figure 13:
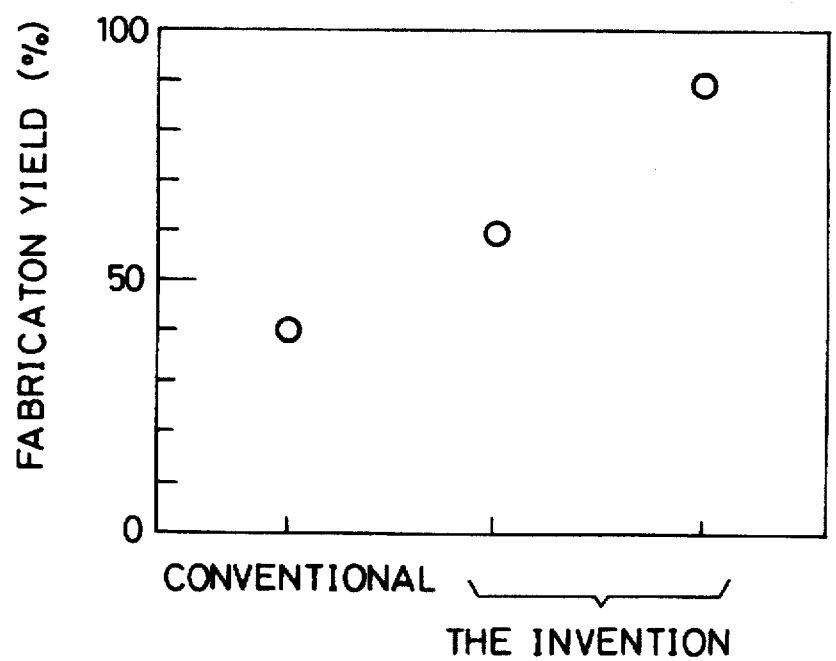
FIG. 13 shows fabrication yields of the methods of the first and second embodiments and the conventional method.

It is seen from FIG. 13 that the method corresponding to the first embodiment has the best fabrication yield of 90% and those corresponding to the first and second embodiments have those of 60%. On the other hand, the method of the comparative example has the worst fabrication yield of 40%.

With the method of the first embodiment, since the growth temperatures of the semiconductor layers 11, 12 and 13 grown after the active layer structure 10 are the same as that of active layer structure 10, the first embodiment is better in fabrication yield than the first and second embodiments With the method of the first and second embodiments, since the arsine partial pressure of the active layer is in the range from $1.6 \times 10^{-7}$ Torr to 0.3 Torr, the second and Fourth embodiments are better in fabrication yield than the comparative example.

Though the test result using the laser water corresponding to the experiment relating to the growth temperature is not shown here, the similar effects to those of the experiment relating to the arsine partial pressure can be obtained.

In the first and second embodiments, any growth conditions excepting that the growth temperature and/or the arsine partial pressure may be applied thereto according to required performances of grown layers.

Though tetramethylgalium (TMG) [$(CH_3)_4Ga$], tetramethylindium (TMI) [$(CH_3)_4In$], arsine ($AsH_3$) and tetramethylaluminum (TMA) [$(CH_3)_4Al$] are used for Ga, In, As and Al components, respectively in the embodiments, it is needless to say that any other material may be used.

Also, the laser wafers of the first and second embodiments have the strained QW active layer or layer structures, however, they may have any other type of the active layer.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A fabrication method of a semiconductor laser using an MOVPE system, comprising the steps of:

growing a first AlGaAs layer on or over a semiconductor substrate;

growing an InGaAs/GaAs active layer containing an InGaAs strained QW sublayer and GaAs barrier sublayers on said first AlGaAs layer at a growth temperature ranging from 580° to 640° C.; and growing a second AlGaAs layer on said active layer; wherein the growth temperature at an end of said step of growing said first AlGaAs layer is controlled to be within a range of 580° to 640° C.;

and wherein the growth temperature of said second AlGaAs layer is equal to the growth temperature of said active layer.

2. A fabrication method or a semiconductor laser as claimed in claim 1, wherein said step of growing said InGaAs/GaAs active layer is carried out under a condition that a total pressure of a growth chamber of said MOVPE system is substantially equal to an atmospheric pressure and a partial pressure of arsine for As component is 1.2 Torr.

3. A method of fabricating a semiconductor laser, comprising the steps of:

growing a first AlGaAs layer on or over a semiconductor substrate;

growing an InGaAs/GaAs active layer containing an InGaAs strained QW sublayer and GaAs barrier sublayers on said first AlGaAs layer at a growth temperature ranging from 580° to 640° C.; and growing a second AlGaAs layer on said active layer;

wherein the growth temperature at an end of said step of growing said first AlGaAs layer is controlled to be within a range of 580° to 640° C., and wherein the growth temperature at a beginning of said step of growing said second AlGaAs layer is equal to the growth temperature of said active layer.

4. A fabrication method of a semiconductor laser as claimed in claim 3, wherein said step of growing said GaAs second layer is carried out under the same growth temperature as that of said step of growing said active layer.

5. A fabrication method of a semiconductor laser as claimed in claim 3, wherein said step of growing said GaAs second layer is ends under a different growth temperature from that of said step of growing said active layer.

6. A fabrication method of a semiconductor laser, the method being carried out using an MOVPE system and a total pressure in a growth chamber of said MOVPE system being kept at an atmospheric pressure, tetramethylgalium [$(CH_3)_4Ga$], tetramethylindium [$(CH_3)_4In$] and arsine ($AsH_3$) being used for Ga, In and As components, respectively;

the method comprising the steps of:

(a) epitaxially growing an AlGaAs first cladding layer on an GaAs substrate;

(b) epitaxially growing an AlGaAs first guiding layer on said AlGaAs first cladding layer;

(c) epitaxially growing an InGaAs QW active layer on said AlGaAs first guiding layer under a condition that a growth temperature ranges from 580° to 640° C., and a partial pressure of arsine in said growth chamber ranges from $1.6 \times 10^{-7}$ Torr to 0.3 Torr; and (d) epitaxially growing an AlGaAs second guiding layer on said InGaAs QW active layer at the same growth temperature as that of said step (c);

(e) epitaxially growing an AlGaAs second cladding layer on said second guiding layer; and (f) epitaxially growing a GaAs cap layer on said second cladding layer.

7. A fabrication method of a semiconductor laser as claimed in claim 6, wherein at least one of said steps (e) and (f) is carried out under the same growth temperature as that of said step (c).

8. A fabrication method of a semiconductor laser as claimed in claim 6, wherein said active layer is of a double QW structure formed of a GaAs and InGaAs strained sublayer and GaAs barrier sublayers disposed at each side of said strained sublayer.

9. A fabrication method of a semiconductor laser, comprising the steps of:

providing a gallium arsenide substrate of a first conductivity type;

growing, on said substrate, a cladding layer of a first conductivity type;

growing, on said cladding layer, a first layer of semiconductor material having a $Al_xGa_{1-x}As$ composition, where a growth temperature at an end of growth time of said first layer is controlled within a range from 580° C. to 640° C.;

growing, on said first semiconductor layer, a second group of layers having at least one $In_yGa_{1-y}As$ strained quantum-well active layer and GaAs barrier layer at a growth temperature ranging 580° C. to 640° C.;

growing, on said second group of layers, a third layer of semiconductor material having said $Al_xGa_{1-x}As$ composition, wherein a growth temperature of of said third layer is a same growth temperature at which said second group of layers are grown;

growing, on said third layer, a fourth layer as a cladding layer of a second conductivity type;

growing, on said fourth layer, a GaAs capping layer of said second conductivity type;

wherein said steps are carried out using a MOVPE system.

10. A fabrication method of a semiconductor laser as claimed in claim 9, wherein said step of growing said second group of layers is carried out under a condition that a total pressure of a growth chamber of said MOVPE system is substantially equal to an atmospheric pressure, and a partial pressure of an arsine for As component is 1.2 Torr.

11. A fabrication method of a semiconductor laser as claimed in claim 9, wherein the method is carried out using an MOVPE system, and a total pressure in a growth chamber of said MOVPE system is kept substantially at an atmospheric pressure; and said step of growing said second group of layers active layer is carried out at a partial pressure of arsine ranging from $1.6 \times 10^{-7}$ Torr to 0.3 Torr.

12. A fabrication method of a semiconductor laser, the method being carried out using an MOVPE system and a total pressure in a growth chamber of said MOVPE system being kept substantially at atmospheric pressure;

the method comprising the steps of:

epitaxially growing a GaAs first layer on or over a GaAs substrate in said growth chamber;

epitaxially growing an InGaAs QW active layer on said GaAs first layer under a condition that a growth temperature ranging from 580° to 640° C. while trimethylgallium [$(CH_3)_3Ga$], trimethylindium [$(CH_3)_3In$] and arsine ($AsH_3$) respectively for Ga, In and As components are supplied into said growth chamber;

said step of growing said active layer being carried out at a partial pressure of arsine ranging from $1.6 \times 10^{-7}$ Torr to 0.3 Torr; and epitaxially growing a GaAs second layer on said InGaAs QW active layer at the same growth temperature as said QW active layer.

* * * * *